Figure 1:
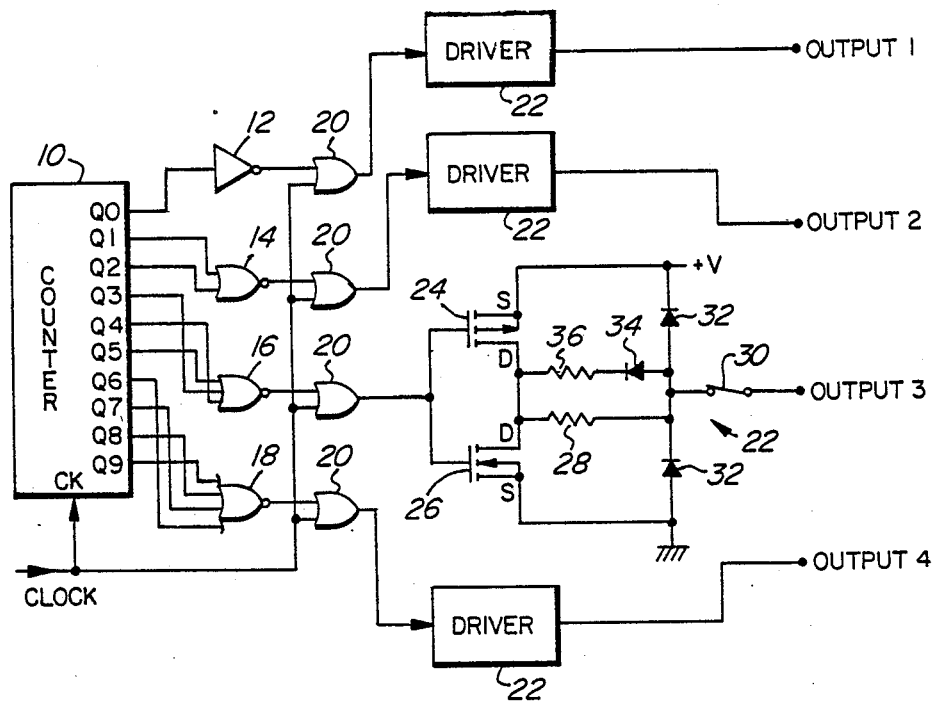

United States Patent [19]
Clegg

[11] Patent Number: 4,901,003
[45] Date of Patent: Feb. 13, 1990

[54] TELECOMMUNICATIONS WIRING TEST APPARATUS AND METHOD INCLUDING TWO COLOR DISPLAY INDICATING CORRECT WIRING

[75] Inventor: David D. Clegg, Nepean, Canada

[73] Assignee: Northern Telecom Limited, Montreal, Canada

[21] Appl. No.: 127,313

[22] Filed: Dec. 2, 1987

[30] Foreign Application Priority Data

Oct. 30, 1987 [CA] Canada .................................. 550735

[51] Int. Cl.[4] .................... G01R 19/145; G01R 31/02
[52] U.S. Cl. ..................................... 324/66; 324/540; 324/539
[58] Field of Search ............... 324/539, 540, 541, 542, 324/66, 556; 379/26

[56] References Cited

U.S. PATENT DOCUMENTS

| | | | |
|---|---|---|---|
| 3,217,244 | 11/1965 | Glover | 324/540 |
| 3,742,350 | 6/1973 | White | 324/66 |
| 3,976,849 | 8/1976 | Champan | 179/175.25 |
| 4,418,312 | 11/1983 | Figler et al. | 324/542 |
| 4,533,864 | 8/1985 | Austin | 324/51 |

FOREIGN PATENT DOCUMENTS

| | | | |
|---|---|---|---|
| 83858 | 6/1980 | Japan | 324/539 |
| 2062317 | 5/1981 | United Kingdom | 324/66 |

*Primary Examiner*—Reinhard Eisenzopf
*Assistant Examiner*—Jack B. Harvey
*Attorney, Agent, or Firm*—R. John Haley

[57] ABSTRACT

Telecommunications (e.g. ISDN) wiring is tested by sequentially supplying to each wire at a first location a pulse sequence identifying that wire while connecting to a common potential other wires, and detecting pulses on the wires at a second location while simultaneously providing a return path connection for the pulses to the other wires. The return path connection is provided by connecting between each wire and a local ground at the second location a resistor and a diode poled to be reverse biassed by pulses on the wire. The detected pulses are counted and the result used to drive a LED (light emitting diode) display comprising N green LEDs indicating correct wiring and N(N-1) red LEDs indicating incorrect connections, the LEDs being arranged in an N by N array with the green LEDs along one diagonal.

28 Claims, 3 Drawing Sheets

TELECOMMUNICATIONS WIRING TEST APPARATUS AND METHOD INCLUDING TWO COLOR DISPLAY INDICATING CORRECT WIRING

This invention relates to the testing of telecommunications in particular, but not exclusively, wiring in a subscriber's premises, such as a residence, for ISDN (integrated services digital network) telecommunications services.

For conventional telephone services, it is well known to provide within a subscriber's premises a plurality of modular sockets at desired locations, these sockets all being connected to the subscriber's telephone line. The sockets each provide four interconnection paths, of which typically only two are used, for the tip and ring wire connections of a telephone to the subscriber's line.

For ISDN telecommunications services, which provide for digital transmission of signals to and from terminals which may include telephones and data terminals, it has been proposed to use a similar form of modular socket, but with eight interconnection paths instead of four. Of the eight interconnection paths, four are designated for use as a transmit path pair and a receive path pair. Again, a plurality of such sockets at different locations within a subscriber's premises would be interconnected, so that any terminal at any location can be connected simply by plugging its modular plug into an adjacent socket.

Such arrangements can result in a subscriber's premises containing a large number of sockets interconnected via considerable lengths of cable, having a minimum of four wires. This considerably increases the risk, compared to conventional telephone service wiring, of faulty wiring due to misconnections and open or short circuits. Accordingly, a need exists for a reliable means for rapidly and accurately verifying that the telecommunications services wiring is correct and complete.

Various test instruments have previously been proposed for testing conventional telephone wiring. For example, Champan U.S. Pat. No. 3,976,849 issued Aug. 24, 1976, entitled "Telephone Wiring Tester", and Austin U.S. Pat. No. 4,533,864 issued Aug. 6, 1985, assigned to Northern Telecom Limited and entitled "Test Instrument with Flexibly Connected Head", describe conventional telephone wiring test instruments providing LED (light emitting diode) indications for proper wiring and operation. Each of these instruments, however, derives power from the telephone subscriber line and accordingly is usable only when the wiring is actually connected to an operational telephone line. Accordingly, even in the context of conventional telephone service wiring such instruments are of limited use, and they are of no use in the context of ISDN service wiring.

An obvious approach to testing the correctness of ISDN service wiring would be to use conventional continuity testing techniques on each of the wires for each socket. Such an approach becomes impractical because of the relatively large number of wires and sockets which must be tested, and consequently the time involved for testing, the likelihood of error in performing the testing itself, and the failure of such testing to detect all fault conditions reliably. Furthermore, any such testing method is further complicated by the absence between different modular sockets of a reliable return (e.g. ground) path. This disadvantage is present in particular in the case of ISDN telecommunications service wiring being installed in buildings under construction, in which electrical wiring can not be presumed to be reliable or complete.

An object of this invention, therefore, is to provide an improved test apparatus and method, especially suitable for testing ISDN telecommunications service wiring.

According to one aspect this invention provides a method of testing wiring comprising at least two wires extending between two locations, comprising the steps of: at a first location, supplying a predetermined signal to a first wire and simultaneously coupling a second wire to a point of reference potential; and at a second location monitoring a signal on the first wire and simultaneously providing a return path connection from the first wire to the second wire.

Thus the invention enables the connections of one wire to be tested while another wire serves as a return path, by virtue of the simultaneous coupling to a point of reference potential (e.g. a local ground or chassis point) at the first location and the return path connection at the second location.

When the wiring comprises more than two wires, preferably a plurality of wires are simultaneously coupled at the first location to the point of reference potential, and a return path connection is simultaneously provided at the second location from the first wire to said plurality of wires.

For testing a plurality of wires the method preferably comprises the step of, at the first location, sequentially and cyclically supplying respective predetermined signals to each of the wires, and simultaneously coupling to the point of reference potential each wire to which a respective predetermined signal is not currently supplied. Advantageously the method comprises the step of, at the second location, simultaneously monitoring a signal on each wire and simultaneously providing a return path connection for such signal from each wire to each other wire.

According to another aspect of this invention there is provided a method of testing telecommunications wiring comprising at least two wires extending between two locations, comprising the steps of: at a first location, sequentially supplying to the wires predetermined signals for identifying the wires, and simultaneously coupling to a point of reference potential at least one wire to which a predetermined signal is not currently supplied; and at a second location monitoring signals on the wires; providing a return path connection from each wire carrying a predetermined signal to at least one wire not currently carrying a predetermined signal; and indicating wiring interconnections between the first and second locations in dependence upon said monitoring.

When the wiring comprises four wires, preferably the predetermined signals comprise four different predetermined signals which are supplied cyclically each to a respective one of the four wires. The method then advantageously also comprises the steps of, at the first location, simultaneously coupling to the point of reference potential a plurality of wires to which predetermined signals are not currently supplied and, at the second location, providing return path connections from each wire carrying a predetermined signal to said plurality of wires not currently carrying predetermined signals.

Preferably the step of indicating wiring interconnections comprises the step of displaying said interconnections with an N by N array of indicators, where N is the number of wires.

In accordance with a further aspect the invention provides test apparatus comprising: first means having a plurality of terminals, means for supplying a predetermined signal to a first terminal, and means for simultaneously coupling a second terminal to a point of reference potential; and second means having a plurality of terminals, means for monitoring a signal at a first terminal, and means for simultaneously providing a return path connection for said signal from the first terminal to a second terminal. Conveniently the means for simultaneously providing a return path connection comprises, for each terminal of the second means, an impedance and a diode each connected between the respective terminal and a point of reference potential of the second means.

The invention also provides test apparatus for testing telecommunications wiring comprising at least two wires extending between two locations, comprising a transmitter unit and a receiver unit for connection to the wires at the respective locations, the transmitter unit comprising: means for sequentially supplying to the wires predetermined signals for identifying the wires; and means for coupling to a point of reference potential at least one wire to which a predetermined signal is not currently supplied; and the receiver unit comprising: means for monitoring signals on the wires; means for providing a return path connection from each wire carrying a predetermined signal to at least one wire not currently carrying a predetermined signal; and means for indicating wiring connections between the transmitter and receiver units in dependence upon said monitoring.

When the wiring comprises four wires preferably in the transmitter unit the means for sequentially supplying predetermined signals comprises means for cyclically generating four different predetermined signals and supplying these each to a respective one of the four wires. The different predetermined signals can comprise predetermined digital signal pulses, e.g. different numbers or widths of pulses for different wires, whereby each wire is readily identified by an individual pulse or pulse sequence.

Preferably in the receiver unit the means for providing a return path connection comprises, for each wire, an impedance and a diode each coupled between the wire and a point of reference potential at the second location, the diode being poled to be reverse biassed by the predetermined signal on the wire.

The means for indicating wiring connections preferably comprises an N by N array of indicators (i.e. $N^2$ indicators in N columns and N rows), e.g. light emitting diodes, of which preferably N are of a first colour, e.g. green, for indicating correct connections and the remaining N(N-1) are of a second, different colour, e.g. red, for indicating incorrect connections. This provides a particularly convenient and advantageous form of display.

Accordingly, the invention further provides apparatus for testing telecommunications wiring comprising a plurality of N wires extending between two locations, the apparatus including means for conducting test signals between said locations via said wiring for determining interconnections via said wiring, and display means for representing said interconnections, the display means comprising an N by N array of indicators, e.g. light emitting diodes, of which N are of a first colour for indicating correct interconnections and N(N-1) are of a second, different, colour for indicating incorrect interconnections. Preferably the N light emitting diodes of a first colour are green light emitting diodes arranged along a diagonal of the N by N array.

Figure 2:
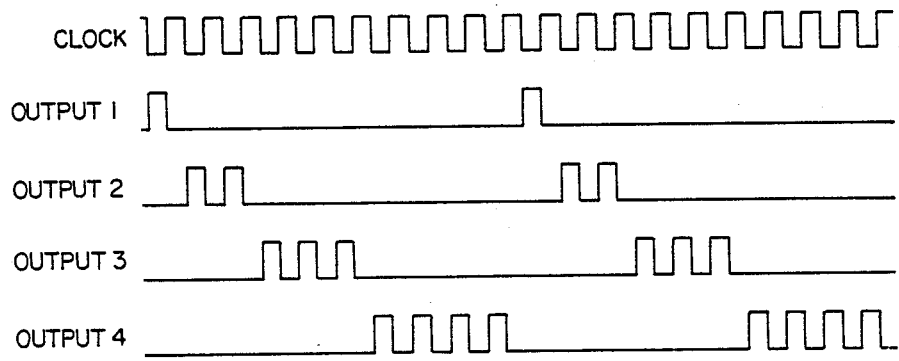
Figure 3:
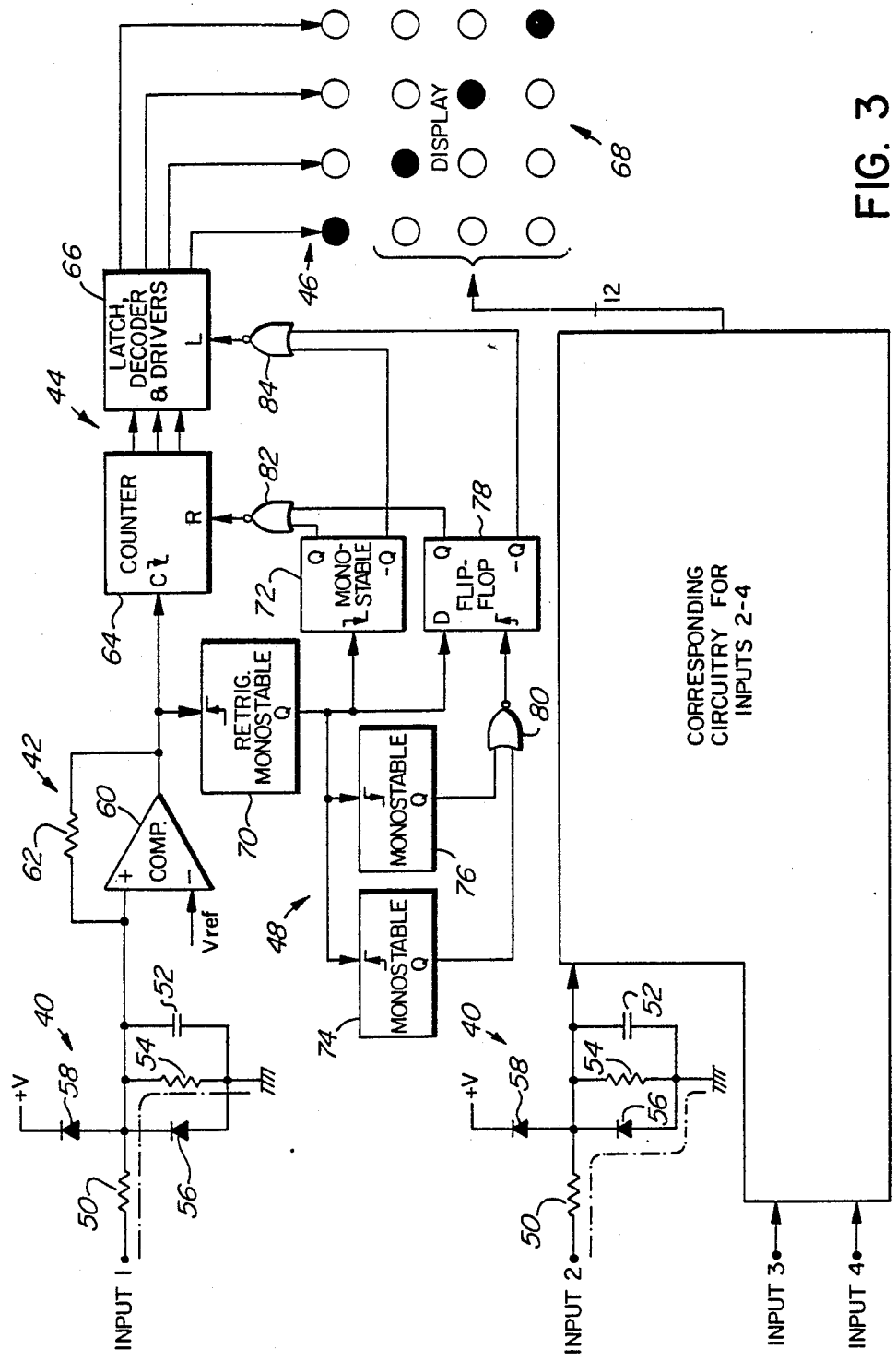

The invention will be further understood from the following description with reference to the accompanying drawings, in which:

FIG. 1 schematically illustrates a transmitter unit of test apparatus in accordance with an embodiment of the invention;

FIG. 2 is a timing diagram illustrating signals which occur in operation of the transmitter unit of FIG. 1;

FIG. 3 schematically illustrates a receiver unit of the test apparatus; and)

Figure 4:
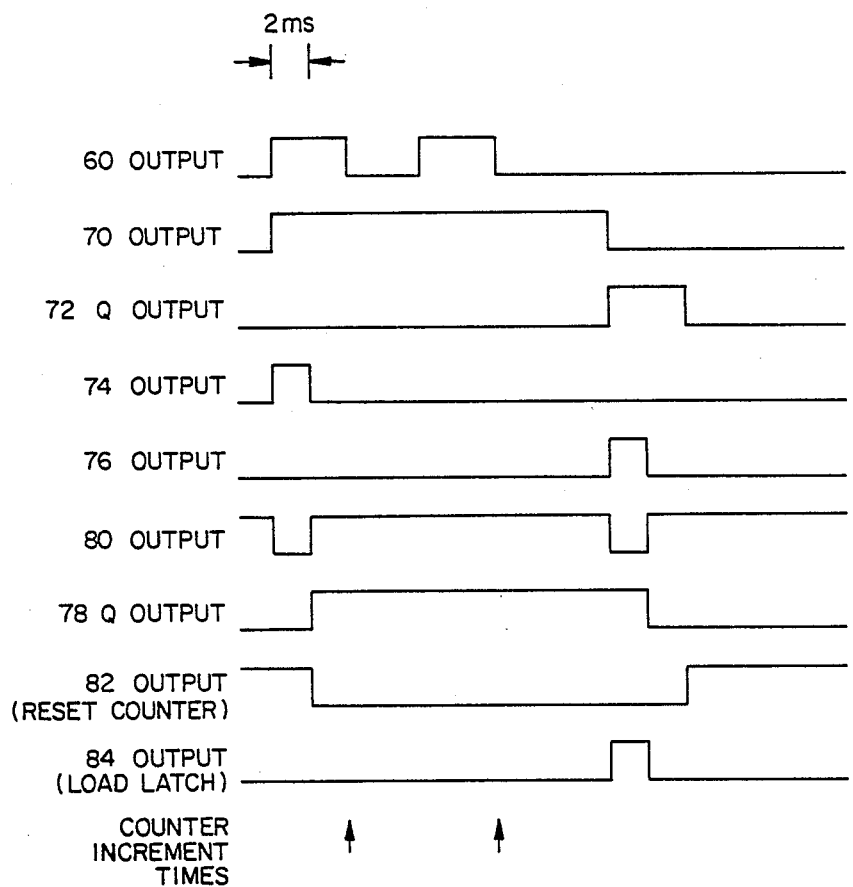

FIG. 4 is a timing diagram illustrating signals which occur in operation of the receiver unit of FIG. 3.

The test apparatus in accordance with the embodiment of the invention illustrated in the drawings and described in detail below consists of two separate units, specifically a transmitter unit and a receiver unit, each of which is battery powered for convenience and portability, which are intended for use in testing the four wire interconnections between modular sockets of ISDN telecommunications service wiring.

For such testing, initially one socket is selected for connection of the transmitter unit, and its wiring is visually inspected to ensure that it is correct. The transmitter unit (FIG. 1) is then connected, via a modular plug which is not illustrated in the drawings, to this socket, to which it remains connected throughout the testing procedure. The receiver unit (FIG. 3) is connected, also via a modular plug which is not illustrated, in turn to each of the other modular sockets, and an indication is rapidly provided at the receiver unit of the correctness or otherwise of the wiring to the respective socket.

Referring to FIGS. 1 and 2, the transmitter unit serves for producing from a clock signal CLOCK periodic pulses on outputs numbered 1 to 4, which outputs are connected to the wiring to be tested via the transmitter unit modular plug as described above. The clock signal is conveniently selected to be a square wave as shown in FIG. 2 with a frequency of 125 Hz, and may be derived within the transmitter unit from a crystal oscillator via a frequency divider circuit. The transmitter unit circuitry shown in FIG. 1 serves to produce sequentially, every ten cycles of the clock signal and hence cyclically or periodically every 80 ms, one pulse at OUTPUT 1, two pulses at OUTPUT 2, three pulses at OUTPUT 3, and four pulses at OUTPUT 4, as also shown in FIG. 2. Each output pulse has a duration of 4 ms.

To this end, the transmitter unit comprises a decade or Johnson counter 10 having a clock input CK, to which the clock signal CLOCK is supplied, and ten outputs Q0 to Q9 at each of which an output pulse is produced in turn. NOR gates 14, 16, and 18 combine respectively the second and third outputs, the fourth to sixth outputs, and the seventh to tenth (Q9) outputs of the counter 10, and an inverter 12 inverts the first output (Q0) of the counter 10, to provide at the outputs of devices 12, 14, 16, and 18 low levels of sequentially and respectively one, two, three, and four clock periods in each sequence of ten clock cycles. The signals at the outputs of the devices 12, 14, 16, and 18 are gated with the clock signal CLOCK in respective OR gates 20, the outputs of which are coupled to the respective outputs 1 to 4 via respective inverting driver stages 22.

For clarity and simplicity, only one of the driver stages 22 is shown in full in FIG. 1, it being understood that the other driver stages have the same form. Each driver stage comprises two power FET (field effect transistor) switches 24 and 26, respectively P-channel and N-channel, whose gates are connected together and to the output of the respective OR gate 20 and whose source-drain paths are connected in series between a transmitter unit supply voltage +V and a transmitter unit chassis or common potential. The interconnected drains of the FET switches 24 and 26 are connected via a resistor 28 in series with a protective fuse 30 to the respective transmitter unit output. Tee fuse 30 serves, in conjunction with normally reverse-biassed diodes 32 connected each between one of the transmitter unit supply voltage rails and the junction between the resistor 28 and the fuse 30, to protect the transmitter unit from excessive voltages which might inadvertently be present on the wiring to which the respective output is connected.

The resistor 28 is selected to have an impedance, e.g. 100 ohms, which approximately matches the impedance of the telecommunications wiring. Connected in parallel with the resistor 28 are a series-connected diode 34, poled as illustrated in FIG. 1, and current-limiting resistor 36 having an impedance of for example 10 ohms.

In operation, during each low level output pulse from the respective OR gate 20 the FET switch 24 is conductive so that a positive voltage pulse, as shown in FIG. 2, is supplied via the resistor 28 and fuse 30 to the respective output. At this time the FET switch 26 is non-conductive and the diode 34 is reverse-biassed. At all other times, when the output from the respective OR gate 20 is high, the FET switch 24 is non-conductive and the FET switch 26 is conductive, whereby the respective output is coupled to the transmitter unit chassis or common potential via the diode 34, current limiting resistor 36, and switch 26. Because of the sequential timing of the pulses at the respective outputs as shown in FIG. 2, it follows that whenever a pulse is supplied to any one of the outputs, the other three outputs are effectively connected to the transmitter unit common potential in this manner.

Referring now to FIG. 3, the receiver unit includes four identical circuits, one associated with each of four inputs numbered 1 to 4, which are connected via a plug to the socket to be tested as already described. In FIG. 3 only the circuitry associated with INPUT 1 is shown in full, the circuitry for each of the other inputs being the same. FIG. 3 also illustrates input circuitry for INPUT 2, and a display arrangement for all of the four inputs, in order to facilitate a full understanding of this embodiment of the invention.

The receiver unit circuitry for each input comprises an input circuit 40, a comparator circuit 42, a counting circuit 44, four display LEDs 46, and a timing circuit 48.

The input circuit 40 couples the respective input to an input of the comparator circuit 42, and comprises a series resistor 50 and shunt capacitor 52, respectively about 1 kilohm and 100 nF, which constitute a noise filter, a 10 kilohm load resistor 54 connected between the comparator circuit input nd the receiver unit chassis or common potential, and hence in parallel with the capacitor 52, a diode 56 poled as shown in FIG. 3 in parallel with the resistor 54, and a normally reverse biassed protective diode 58 connected between the comparator circuit input and a supply voltage +V of the receiver unit. The diodes 56 and 58, and likewise the diodes 32 and 34 in the driver stages 22 of the transmitter unit, are conveniently Schottky diodes having a relatively small forward voltage drop. The resistor 50 serves not only for noise filtering with the capacitor 52 but also to limit current in the event that an excessive voltage is present on a wire to which the respective input is connected during testing.

FIG. 3 shows the input circuit 40 for each of two inputs 1 and 2. In the event that a positive voltage pulse (e.g. as shown for OUTPUT 1 in FIG. 2) is present at INPUT 1, then as shown by a chained line in FIG. 3 a current path exists from the INPUT 1 via the resistors 50 and 54 (the diode 56 for this input being reverse biassed) to the receiver unit common potential. Also as shown in FIG. 3 by a chained line for the INPUT 2 (and equally for each other input), if another input does not receive a voltage pulse at the same time, then a return current path exists from the receiver unit common potential via the diode 56, which for this input is forward biassed, and the resistor 50 to the respective input.

Now, assuming that the wiring being tested is correct, it will interconnect the outputs 1 to 4 of the transmitter unit to the inputs 1 to 4 respectively of the receiver unit. Then, during each voltage pulse on any output from the transmitter unit, there is a complete outgoing and return path. For example, for the single voltage pulse at the OUTPUT 1, the outgoing path is from the transmitter unit +V supply voltage, via the conductive FET switch 24, resistor 28, and fuse 30 of the driver 22 of OUTPUT 1 of the transmitter unit, via the wiring under test to the INPUT 1 of the receiver unit, and via the resistors 50 and 54 of the input circuit 40 of this input of the receiver unit, to the receiver unit common potential. A return path simultaneously exists from the receiver unit common potential, via the diode 56 and resistor 50 of the input circuit 40 of input 2 of the receiver unit, via INPUT 2 and the wiring under test to OUTPUT 2 of the transmitter unit, and via the fuse 30, diode 34, resistor 36, and FET switch 26 of the driver stage 22 of output 2 of the transmitter unit, to the transmitter unit common potential. A similar return path simultaneously exists for each of the third and fourth inputs and outputs.

The presence of three return paths when voltage pulses are applied to any of the four outputs of the transmitter unit ensures that, even in the event of multiple faults on the wiring being tested, a fault condition can be reliably detected by counting pulses at the receiver unit. This pulse counting, and the resulting display, is described below with reference to FIGS. 3 and 4.

The input to the comparator circuit 42, namely the voltage developed across the resistor 54, is compared in a comparator 60, provided with hysteresis by a feedback resistor 62, with a reference voltage Vref, which is supplied to the comparator circuits 42 for all of the receiver unit inputs Pulses output from the comparator 60 are supplied to a clock input C of a counter 64 of the counting circuit 44 and are counted thereby, the resultant count being latched and decoded in a latch, decoder, and driver unit 66 and being used to drive one of the four display LEDs 46, arranged in one of four rows of a display 68. The particular LED 46 which is illuminated is determined by the number of pulses counted, i.e. the first LED for one pulse, the second for two pulses, and so on. LEDs shown solid in FIG. 3, and extending along one diagonal of the display 68, are green, indicating a correct number of pulses received for the respective input and hence correct wiring for that connection, and the other LEDs are red to indicate a fault as discussed further below.

The timing circuit 48 serves for resetting the counter 64 via a reset input R, and loading the latch of the unit 66 via a load or strobe input L, at appropriate times dependent upon the occurrence of pulses at the output of the comparator circuit 42. To this end the timing circuit 48 comprises a rising-edge triggered retriggerable 10 ms monostable 70, a falling-edge triggered 4 ms monostable 72, rising- and falling-edge triggered 2 ms monostables 74 and 76 respectively, a rising-edge clocked D-type flip-flop 78, and three two-input NOR gates 80, 82, and 84. The monostable 70 has its trigger input connected to the output of the comparator circuit 42 and its Q output connected to the trigger inputs of the other monostables and the data input D of the flip-flop 78. The NOR gate 80 has its inputs connected to Q outputs of the 2 ms monostables 74 and 76 and its output connected to the clock input of the flip-flop 78. The NOR gate 82 has its inputs connected to Q outputs of the monostable 72 and the flip-flop 78 and its output connected to the reset input R of the counter 64. The NOR gate 84 has its inputs connected to the complementary or -Q outputs of the monostable 72 and the flip-flop 78 and its output connected to the load input L of the latch of the unit 66.

The operation of the timing circuit 48 is described below with additional reference to FIG. 4, assuming by way of example that two pulses are present at the output of the comparator 60. The monostable 70 is triggered on the rising edge of the first pulse, and is retriggered by the rising edge of each subsequent pulse, to provide in this case an output pulse of 18 ms duration. The 10 ms period of the monostable 70 is selected to be a little more than the 8 ms period of pulses produced by the transmitter unit, to provide a "window" for pulse detection.

The edges of the monostable 70 output pulse trigger the monostables 74 and 76 to provide 2 ms pulses which are combined by the gate 80 to clock the flip-flop 78, whereby the flip-flop 78 Q output is the same as the monostable 70 output but delayed by 2 ms. This output is combined with the 4 ms pulse produced by the monostable 72 at the end of the monostable 70 pulse to produce the reset input of the counter 64 (82 output) and the load input of the latch (84 output). FIG. 4 also shows the times at which the counter 64 is incremented, by the falling edges of the pulses from the output of the comparator 60.

As illustrated by FIG. 4, the arrangement of FIG. 3 is self-clocking in that, 2 ms after the rising edge of a first pulse in a sequence of pulses from the output of the comparator 60, the reset input to the counter 64 goes low to enable the counter to count pulses, and the counter is incremented with the falling edge of this first pulse and the falling edges of any subsequent pulses detected within the window period. After the last such pulse in the sequence, the count is latched with the output pulse from the gate 84, and subsequently the counter 64 is reset again by the output of the gate 82 going high, so that the circuit is prepared for a subsequent pulse sequence. The latching recurs (in normal operation) every 80 ms, so that the resultant display is constantly updated.

If all four green LEDs of the display 68 are lit, this indicates that the wiring to the socket being tested is correct and complete. Any other display result not only indicates the presence of a fault, but also provides a good indication of the nature of the fault. Thus one display row with no lit LED indicates an open circuit of the respective connection wire, two LEDs lit in the same display column (one green, one red) indicate a short circuit between the respective connection wires, red LEDs lit in two or more different columns and rows indicate crossed-over connections, and so on. The existence and nature of faulty wiring are thus greatly facilitated.

In order to avoid the possibility of an erroneous display being produced on initial switch-on of power to the receiver unit, the receiver also includes switch-on reset circuitry (not illustrated) which holds the latches in the units 66 reset, and hence the display 68 blanked, for a sufficient period following switch-on to allow at least one full set of pulse sequences to be received and counted.

Although the invention has been described in relation to a specific embodiment, it should be appreciated that many modifications, variations, and adaptations may be made without departing from the scope of the invention, which is defined in the claims.

In particular, the invention is not restricted to the particular sequential pulse timing and detection arrangements described, nor to the digital or pulsed signals, display arrangements, or driver stage and input circuitry used. The invention is also applicable to synchronous timing of the transmitted signals, different coding schemes for the different connection wires (for example n-bit binary coding for up to $2^n$ connection wires), including pulse sequences interleaved or overlapping in time but still providing return paths, larger or smaller numbers of connection wires, different pulse detection, counting, and decoding schemes, different forms of display, and the transmission of analog or other signals rather than pulses. Furthermore, the driver stages 22 and input circuits 40 may have different forms; in particular, the protection circuits included therein may be dispensed with, and in the input circuits 40, the noise filter may be dispensed with or the diode 56 may be connected directly to the input. Numerous other possibilities within the scope of the invention may occur to those of ordinary skill in the art.

What is claimed is:

1. A method of testing wiring comprising at least two wires extending between two locations, comprising the steps of:
   at a first location, sequentially and cyclically supplying respective predetermined signals to each of the wires, and simultaneously sequentially and cyclically coupling to a point of common potential at the first location at least one other wire to which a respective predetermined signal is not currently supplied; and
   at a second location, monitoring a signal on each wire and simultaneously providing a return path connection for such signal from each wire to at least said one other wire via a unidirectional current conducting device.

2. A method as claimed in claim 1 wherein the step of providing a return path connection comprises providing at the second location, for each wire, an impedance and a diode in parallel between the wire and a point of reference potential at the second location.

3. A method as claimed in claim 1 wherein each predetermined signal comprises at least one digital signal pulse.

4. A method as claimed in claim 3 wherein the step of monitoring comprises cyclically counting pulses.

5. A method as claimed in claim 1 wherein the wiring comprises more than two wires, a plurality of wires are simultaneously coupled at the first location to the point of common potential, and a return path connection is simultaneously provided at the second location from the first wire to said plurality of wires.

6. A method as claimed in claim 5 wherein the or each predetermined signal comprises at least one digital signal pulse.

7. A method as claimed in claim 10 wherein the step of monitoring comprises cyclically counting pulses.

8. A method as claimed in claim 5 wherein the wiring comprises telecommunications wiring having four wires.

9. A method of testing telecommunications wiring comprising at least two wires extending between two locations, comprising the steps of:
at a first location, sequentially supplying to the wires predetermined signals for identifying the wires, and simultaneously coupling to a point of common potential each wire to which a predetermined signal is not currently supplied; and
at a second location;
monitoring signals on the wires;
providing a return path connection via a unidirectional current conducting device from each wire carrying a predetermined signal to each wire not currently carrying a predetermined signal; and
indicating wiring interconnections between the first and second locations in dependence upon said monitoring.

10. A method as claimed in claim 9 wherein the wiring comprises four wires and the predetermined signals comprise four different predetermined signals which are supplied cyclically each to a respective one of the four wires.

11. A method as claimed in claim 9 wherein each predetermined signal comprises a predetermined number of digital signal pulses.

12. A method as claimed in claim 9 wherein the step of indicating wiring interconnections comprises the step of displaying said interconnections with an N by N array of indicators, where N is the number of wires.

13. A method as claimed in claim 9 wherein the step of providing a return path connection comprises providing, for each wire, an impedance and a diode each coupled between the wire and a point of common potential at the second location, the diode being poled to be reverse biassed by the predetermined signal on the wire.

14. Test apparatus comprising:
first means having a plurality of more than two output terminals, means for supplying respective predetermined signals sequentially to the output terminals, and means for simultaneously coupling to a point of common potential each output terminal to which the respective predetermined signal is not currently supplied; and
second means having a like plurality of input terminals, means for monitoring said respective predetermined signals at the input terminals, and unidirectional current conducting means for simultaneously providing return path connections for said respective predetermined signals from each input terminal to each other input terminal.

15. Test apparatus as claimed in claim 14 wherein the unidirectional current conduction means comprises, for each input terminal of the second means, a diode connected in parallel with an impedance between the respective input terminal and a point of common potential of the second means.

16. Test apparatus as claimed in claim 15 wherein the first means has four output terminals and the second means has four input terminals.

17. Test apparatus for testing telecommunications wiring comprising four wires extending between two locations, comprising a transmitter unit and a receiver unit for connection to the wires at the respective locations, the transmitter unit comprising:
means for sequentially and cyclically supplying to the wires predetermined signals for identifying the wires; and
means for coupling to a point of common at the transmitter unit each wire to which a predetermined signal is not currently supplied; and the receiver unit comprising:
means for monitoring signals on the wires;
diode means for providing a return path connection from each wire carrying a predetermined signal to each wire not currently carrying a predetermined signal; and
means for indicating wiring connections between the transmitter and receiver units in dependence upon said monitoring.

18. Apparatus as claimed in claim 17 wherein in the transmitter unit the means for sequentially and cyclically supplying predetermined signals comprises means for cyclically generating four different predetermined digital signal pulse sequences and supplying these each to a respective one of the four wires.

19. Apparatus as claimed claim 18 wherein the means for indicating wiring connections comprises an N by N array of indicators, where N is the number of wires.

20. Apparatus as claimed in claim 19 wherein each indicator comprises a light emitting diode.

21. Apparatus as claimed in claim 20 wherein the N by N array comprises N light emitting diodes of a first color for indicating correct connections and N(N-1) light emitting diodes of a second, different color for indicating incorrect connections.

22. Apparatus as claimed in claim 17 wherein in the receiver unit the diode means for providing a return path connection comprises, for each wire, a diode connected in parallel with an impedance between the wire and a point of common potential at the receiver unit, the diode being poled to be reverse biassed by the predetermined signal on the wire.

23. Apparatus as claimed in claim 17 wherein the means for indicating wiring connections comprises an N by N array of indicators, where N is the number of wires.

24. Apparatus as claimed in claim 23 wherein each indicator comprises a light emitting diode.

25. Apparatus as claimed in claim 24 wherein the N by N array comprises N light emitting diodes of a first color for indicating correct connections and N(N-1) light emitting diodes of a second, different color for indicating incorrect connections.

26. Apparatus for testing telecommunications wiring comprising a plurality of N wires extending between two locations, the apparatus including means for conducting test signals between said locations via said wiring for determining interconnections via said wiring, and display means for representing said interconnections, the display means comprising an N by N array of indicators of which N are of a first color for indicating correct interconnections and N(N-1) are of a second, different, color for indicating incorrect interconnections.

27. Apparatus as claimed in claim 26 wherein the indicators comprise light emitting diodes.

28. Apparatus as claimed in claim 27 wherein the N light emitting diodes of a first color are green light emitting diodes arranged along a diagonal of the N by N array.

* * * * *